(12) United States Patent
Ko

(10) Patent No.: US 6,218,854 B1
(45) Date of Patent: Apr. 17, 2001

(54) DATA LINE TERMINATION CIRCUITS AND INTEGRATED CIRCUIT DEVICES INCLUDING ATTENUATION CIRCUIT AND CHARGE/DISCHARGE CIRCUIT

(75) Inventor: Beom-Kyu Ko, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/295,990

(22) Filed: Apr. 21, 1999

(30) Foreign Application Priority Data

Apr. 22, 1998 (KR) .................................................. 98-14363

(51) Int. Cl.[7] ........................ H03K 17/16; H03K 19/003
(52) U.S. Cl. .................................. 326/30; 326/83; 326/86
(58) Field of Search .................................. 326/30, 83, 86, 326/17, 21–24, 26–27

(56) References Cited

U.S. PATENT DOCUMENTS 5,055,713 * 10/1991 Watanabe et al. ....................... 326/58
5,528,168 * 6/1996 Kleveland ............................... 326/30

FOREIGN PATENT DOCUMENTS 1-245616 * 9/1989 (JP) ........................................ 326/87

OTHER PUBLICATIONS

Kawahara et al, "Low–Power Chip Interconnection by Dynamic Termination", IEEE Journal of Solid–State Circuits, vol. 30, No. 9, Sep. 1995, pp. 1030–1034.

* cited by examiner

*Primary Examiner*—Michael Tokar
*Assistant Examiner*—Steven S. Paik
(74) *Attorney, Agent, or Firm*—Myers Bigel Sibley & Sajovec

(57) ABSTRACT

Integrated circuit devices include an input pin coupled to a data line, through which an input signal is received. An input circuit is coupled to the input pin. The input circuit transfers the input signal to internal circuitry of the integrated circuit device. The data line termination circuit is coupled between the input pin and the input circuit, and reduces ringing of the input signal. The data line termination circuit includes an attenuation circuit coupled to the input pin, that reduces overshoot of the input signal. A charge/discharge circuit is coupled between the attenuation circuit and the input circuit, and charges the undershoots of the input signal with the power supply when a level of the input signal changes from logic low level to high level, and discharges the undershoots of the input signal to ground when the level of the input signal changes from the logic high level to the low level.

17 Claims, 17 Drawing Sheets

DATA LINE TERMINATION CIRCUITS AND INTEGRATED CIRCUIT DEVICES INCLUDING ATTENUATION CIRCUIT AND CHARGE/DISCHARGE CIRCUIT

FIELD OF THE INVENTION

The present invention relates to integrated circuits, and more particularly to data line termination circuits for integrated circuits that can reduce ringing of a signal occurring when logic level of the signal is changed.

BACKGROUND OF THE INVENTION

Integrated circuit devices, such as, processors and memories operating at high speeds, and/or devices which use relatively long conductive interconnections, may suffer from reduced performance. In particular, overshoot signal reflection or transmission line effect problems may occur, thereby reducing performance.

For example, when a zero volt signal is changed to a five volt signal on a conductor or bus which is long in length or has a fast edge rate, and if the bus or conductive line is not properly impedance-matched, the conductive line or bus may take some time to settle to the 5 volt value from the 0 volt value due to one or more reflections taking place one or both ends of the bus.

As manufacturing techniques of semiconductor devices improve, operational speed may also increase. Typical rise times (or lead times) and fall times (or trail times) for various semiconductor manufacturing techniques are listed in the following Table 1.

TABLE 1

| Manufacturing technique | Rise time (on-chip) | Rise time (chip to chip) |
|---|---|---|
| CMOS | 0.5–2.0 micro second | 2–4 micro second |
| Bipolar | 50–200 pico second | 200–400 pico second |
| GaAs | 20–100 pico second | 100–250 pico second |

When the rise time "tr" and the fall time "tf" are reduced by 2.5 times shorter than a data line delay time "td", the received signal to a receiver may be distorted. This is because when the input impedance and the characteristic impedance of the data line are not matched, the transmitted signal to the receiver may be reflected to the transmitter through the data line. When (2.5*td)>tr or (2.5*td)>tf, a transmitted signal from a transmitter may already settle to a desired level, such as a stable level of 0V or Vcc.

However, since the delay time of a data line is longer than the rise and fall time, the reflected signal to the transmitter may overlap the stable signal before the transmitting signal is transmitted to the receiver, and thereby reflecting to the input signal of the receiver. The above sequential process may repeatedly take place from the rising edge or the falling edge of the transmitting signal.

FIG. 1 is a waveform illustrating an example of ringing of the input signal of a receiving integrated circuit device or a receiver in accordance with an output signal of a transmission integrated circuit device or a transmitter during signal transmission between conventional integrated circuit devices. As shown in FIG. 1, the received signal is hardly distorted. However, the signal transmitted to the receiver may be unusable, due to ringing.

In order to reduce the above-described distortion, impedance matching may be adapted to a data line between the integrated circuit devices. Serial or parallel matching may be used.

Serial adaptation or a serial matching is provided by matching the output impedance of the transmitter to the characteristic impedance of the data line and maintaining an open state for the port near the receiver. However, the impedance of data line may be changed, so that it may be difficult to control.

Parallel matching is provided by matching the impedance of receiver to the characteristic impedance of the data line. However, in the parallel matching scheme, power in the static state may be consumed and a signal having a reduced deviation at the output port of the data line may be used. Furthermore, in parallel matching, the signal transmission between the integrated circuits may have a heterogenous structure that is difficult to match the input impedance of the receiver to the characteristic impedance of the data line.

FIG. 2 is a schematic view illustrating an example of a parallel matching scheme in conventional integrated circuit devices coupled to each other through a data line. A CMOS inverter 12 is provided in a transmitter 10 and used for an output buffer, and a CMOS inverter 16 is provided in a receiver 14 and used for an input buffer circuit.

The transmitter 10 is coupled to the receiver 14 through a data line 18. A terminal resistor 20 is coupled between a power supply level (power source) Vdd and one side of the data line 18 near the receiver 14. The terminal resistor 20 may be integrated inside the receiver 14, or may be directly coupled to the data line 18 outside the receiver. Assume the characteristic impedance Zo of the data line 18 and the resistance of the terminal resistor 20 is matched to 50 ohm, and the delay time td of the data line 18 is 1 nS (nano second).

FIG. 3A is a waveform illustrating signal V22 at a node 22 of a side of a receiver in accordance with input signal A of a transmitter in the conventional integrated circuit devices coupled to each other through the data line as shown in FIG. 2. The received signal V22 is not disturbed according to the parallel matching of the above condition, thereby being similar to the transmitting signal A as shown in FIG. 3A.

FIG. 3B is a waveform illustrating dynamic current i1 at one position 1 of a transmitter output buffer and the dynamic current i2 at the other position 2 of the transmitter output buffer in the conventional integrated circuit devices coupled to each other through the data line as shown in FIG. 2. FIG. 3C is a waveform illustrating the dynamic current ia of the data line in the conventional integrated circuit devices coupled to each other through the data line as shown in FIG. 2.

As described above, although the received signal V22 may not be distorted by the parallel matching scheme as shown in FIG. 2, the dynamic current ia flows in the data line as shown in FIG. 3C. Therefore, the devices may consume large amounts of power during the signal transmission. Thus, the parallel matching scheme may not be adapted to low-power chip interconnection, such as are used in low-power consumption integrated circuit devices such as the processors and memories in portable computers, portable terminals, and portable telephones.

FIG. 4 is a schematic view illustrating another example of a parallel matching scheme in conventional integrated circuit devices coupled to each other through a data line. When the logic level of the input signal is changed from level 0 to 1 or from level 1 to 0, the impedance-matching scheme by a terminal device 34 is adapted to the data line between the integrated circuit devices as shown in FIG. 4. Therefore, the terminal device 34 maintains the open state when the logic level stays at 1 or 0. This scheme is called a dynamic termination DT, and is known to those skilled in the art.

As shown in FIG. 4, a transmitter 24 has a CMOS inverter 26 as the output buffer circuit, and a receiver 28 has a CMOS inverter 30 as the input buffer circuit. The transmitter 24 is coupled to the receiver 28 through a data line 32.

The terminal device 34 is coupled to one side node 40 of the data line 32 near the receiver 28 in parallel. The terminal device 34 has a resistor 36 and a capacitor 38 coupled to each other in series. The resistor 36 is coupled between the data line 32 and the capacitor 38.

FIG. 5A is a waveform illustrating a signal V40 at a node 40 of a side of the receiver in accordance with input signal A of the transmitter in the conventional integrated circuit devices coupled to each other through the data line as shown in FIG. 4. FIG. 5B is a waveform illustrating the dynamic current ia of the data line in the conventional integrated circuit devices coupled to each other through the data line as shown in FIG. 4.

The signal V40 of a node 40 at the side of the receiver may not be distorted as shown in FIG. 5A, but a dynamic current ia may still flow in the data line as shown in FIG. 5B. Assume that the characteristic impedance Zo of the data line 32 and resistance of the terminal device 34 are matched to 50 ohm, and delay time "td" of the data line 32 is 1 nS (nano second). The received signal V40 may not be distorted by the parallel matching of the above condition, thereby being similar to the transmitting signal A.

The capacitance of capacitor 38 in the terminal device 34 is approximately (25*td)/Zo. Hence, if the capacitance of capacitor 38 is 500 pF (pico Farad), it may be difficult to integrate the capacitor 38 into the receiver 28. Furthermore, since the parallel matching scheme as shown in FIG. 4 has a large capacitor, the dynamic current may be greatly increased as shown in FIG. 5B. The dynamic termination matching technique for resolving the above problem is described in IEEE JOURNAL OF SOLID-STATE CIRCUITS, VOL. 30. NO. 9 "Low-Power Chip Interconnection by Dynamic Termination" published on Sep. 30, 1995.

FIG. 6 is a schematic diagram illustrating a further example of a parallel matching scheme in conventional integrated circuit devices coupled to each other through a data line. Referring to FIG. 6, there is shown a circuit related to the above dynamic termination DT published in the IEEE cited above. Since the circuit of FIG. 6 is described in the above-cited publication, no further explanation is necessary. According to the dynamic termination DT as shown in FIG. 6, the dynamic current may be reduced to the extent of consumption related to the above-described circuit.

FIG. 7A is a waveform illustrating signal V42 at a node 42 of a side of the receiver in accordance with input signal A of the transmitter in the conventional integrated circuit devices coupled to each other through the data line as shown in FIG. 6. FIG. 7B is a waveform illustrating the dynamic current i44 of one position 44 of the transmitter output buffer and the dynamic current i46 of the other position 46 of the transmitter output buffer in the conventional integrated circuit devices coupled to each other through the data line as shown in FIG. 6. FIG. 7C is a waveform illustrating the dynamic current ia of the data line in the conventional integrated circuit devices coupled to each other through the data line as shown in FIG. 6.

As can be seen from the above description, the signal may be prevented from distorting, but a large amount of dynamic current still may be consumed. According to the above described parallel matching scheme, the large amount of dynamic current may be consumed while the signal is transmitted and ringing may occur from the received signal. Also, the above described matching scheme may be adapted to 1:1 (point-to-point) data transmission, but may be difficult to adapt to 1:N (point-to-multipoint; N is 2 or more integer) data transmission because each terminal impedance may be different.

SUMMARY OF THE INVENTION

It is therefore an object of the present invention to provide data line termination circuits that can reduce ringing of signals and that can reduce dynamic current flow when the logic level of the signal changes.

It is another object of the invention to provide data line termination circuits that can reduce power consumption while the signal is transmitted.

It is a further object of the invention to provide data line terminal circuits that can be adapted to point-to-multipoint data transmission schemes.

These and other objects are provided, according to a first aspect of the present invention, by integrated circuit devices including an input pin coupled to a data line, through which an input signal is received. An input circuit is coupled to the input pin. The input circuit transfers the input signal to internal circuitry of the integrated circuit device. The data line termination circuit is coupled between the input pin and the input circuit, and reduces ringing of the input signal. The data line termination circuit includes an attenuation circuit coupled to the input pin, that reduces overshoot of the input signal. A charge/discharge circuit is coupled between the attenuation circuit and the input circuit, and charges the undershoots of the input signal with the power supply when a level of the input signal changes from logic low level to high level, and discharges the undershoots of the input signal to ground when the level of the input signal changes from the logic high level to the low level.

The attenuation circuit preferably comprises a first inverter having an output port, and an input port coupled to a first node. A second inverter has an input port and an output port. The input port is coupled to the first node. A first PMOS transistor has a drain and a source that are serially coupled between the input pin and the first mode, and a gate coupled to an output port of the first inverter, and is driven by an output signal of the first inverter in order to reduce the overshoot of the input signal. A first NMOS transistor has a drain and a source that are serially coupled between the input pin and the first node, and a gate coupled to an output port of the second inverter, and is driven by an output signal of the second inverter in order to reduce the overshoot of the input signal.

The first PMOS transistor and the first NMOS transistor preferably function as a resistor. The attenuation circuit may comprise a plurality of first inverters that are serially coupled between the first PMOS transistor and the first node. The attenuation circuit may comprise a plurality of second inverters that are serially coupled between the first NMOS transistor and the first node.

The charge/discharge circuit preferably comprises a first capacitor that is coupled between the power supply and a first node, and which is coupled between the attenuation circuit and the input circuit, and a second capacitor that is coupled between the first node and ground. The first capacitor preferably is a PMOS transistor having a source and a drain coupled to the power supply, and a gate coupled to the first node. The second capacitor preferably is an NMOS transistor having a source and a drain coupled to ground, and a gate coupled to the first node.

The charge/discharge circuit preferably comprises a first resistor having two ports, one port being coupled to the power supply and other port coupled to one port of the first capacitor. A second resistor has two ports, one port coupled to ground and other port coupled to one port of the second capacitor. The charge/discharge circuit preferably comprises a first switch coupled between the power source and the first node, and switched by the voltage of a second node defined between the first resistor and the first capacitor. A second switch is coupled between the first node and ground, and switched by the voltage of a third node defined between the second resistor and the second capacitor.

The first switch preferably is a PMOS transistor, and the second switch preferably is an NMOS transistor. The input circuit may be coupled in parallel to a voltage acceleration circuit. The voltage acceleration circuit compensates for the delay time in the data line termination circuit.

As described above, data line termination circuits and integrated circuit devices having the same can reduce ringing by the data line termination circuit. The dynamic current consumption also may be reduced, thereby allowing improved operational performance of the integrated circuit device.

DESCRIPTION OF THE PREFERRED EMBODIMENTS

Figure 1:
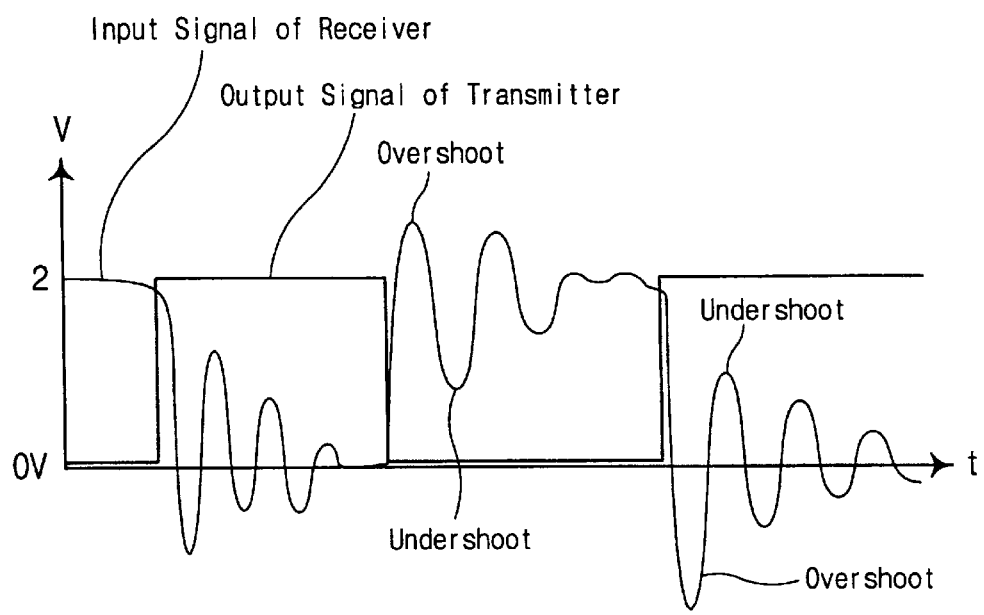
FIG. 1 is a waveform illustrating an example of a ringing of an input signal of a receiving integrated circuit device, a receiver in accordance with an output signal of a transmission integrated circuit device, and a transmitter in signal transmission between conventional integrated circuit devices.
Figure 2:
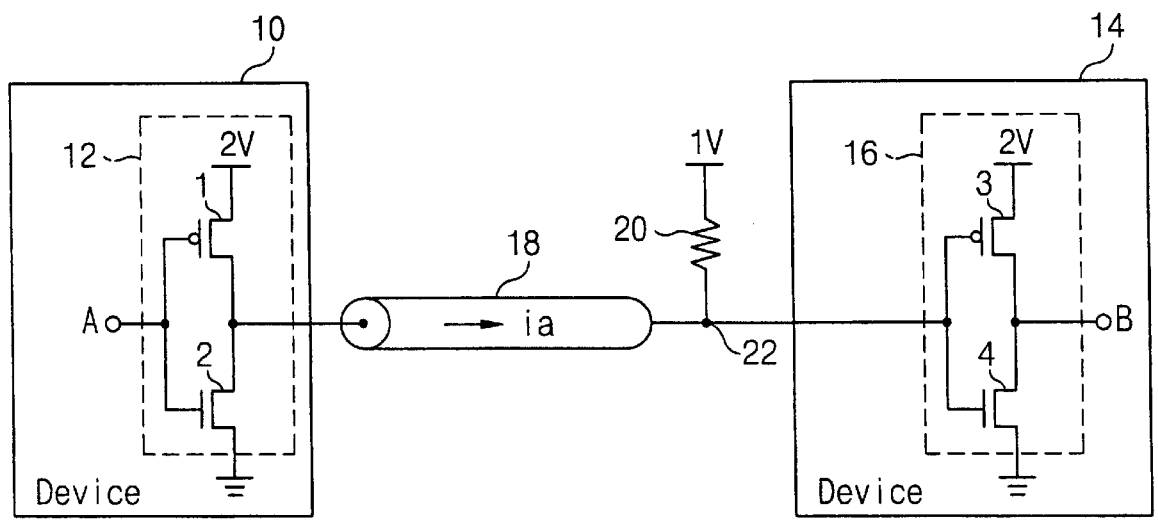
FIG. 2 is a schematic view illustrating an example of a parallel matching scheme in conventional integrated circuit devices coupled to each other through a data line.
Figure 3A:
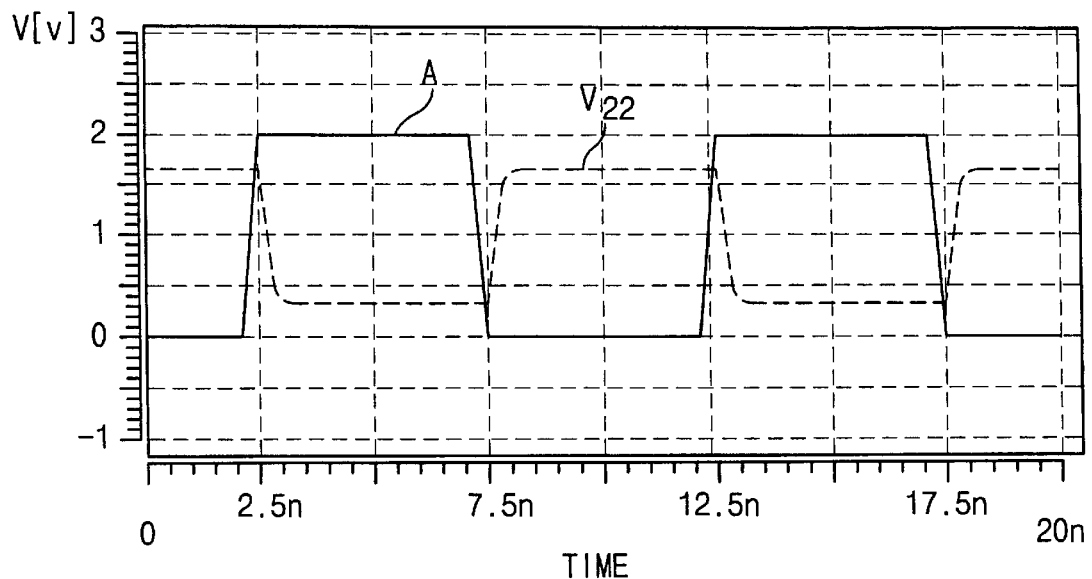
FIG. 3A is a waveform illustrating a signal at a node of a side of a receiver in accordance with an input signal of a transmitter in the conventional integrated circuit devices coupled to each other through a data line as shown in FIG. 2.
Figure 3B:
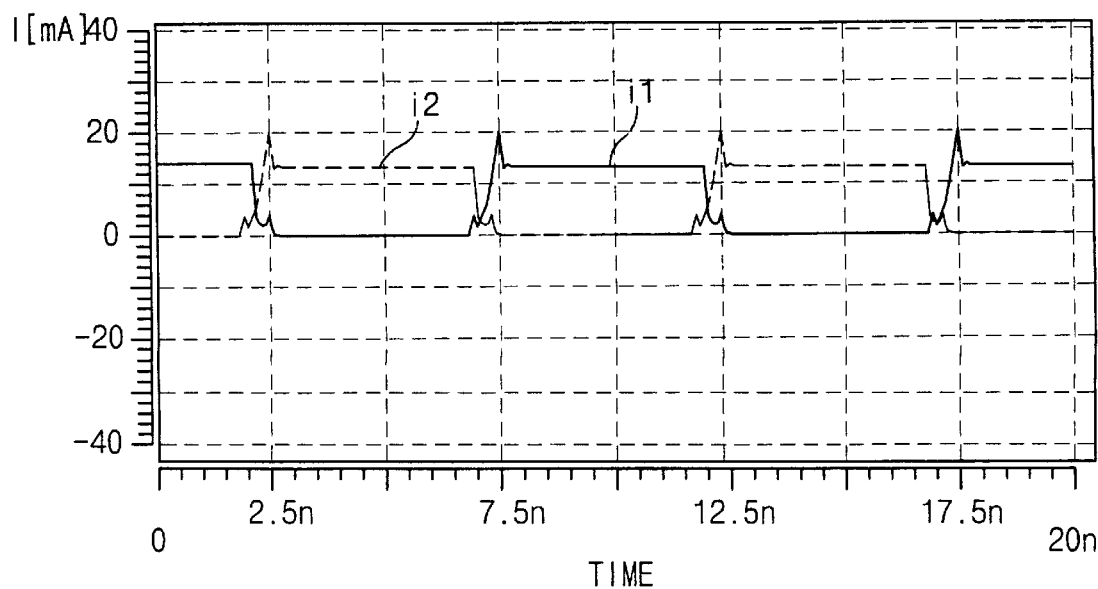
FIG. 3B is a waveform illustrating the dynamic current at one position of a transmitter output buffer and the dynamic current at the other position of the transmitter output buffer in the conventional integrated circuit devices coupled to each other through a data line as shown in FIG. 2.
Figure 3C:
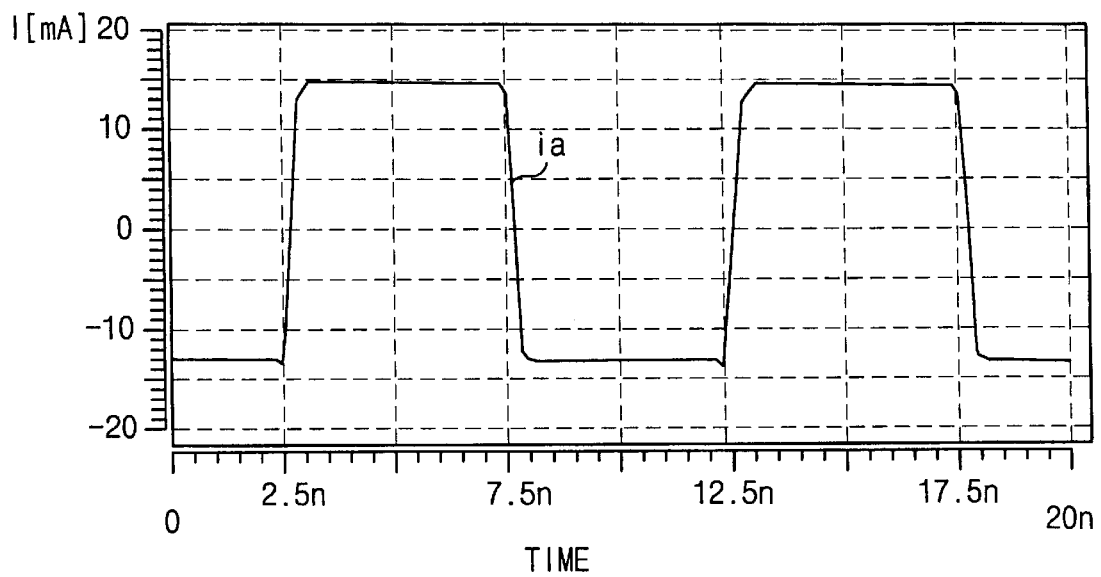
FIG. 3C is a waveform illustrating the dynamic current of the data line in the conventional integrated circuit devices coupled to each other through the data line as shown in FIG. 2.
Figure 4:
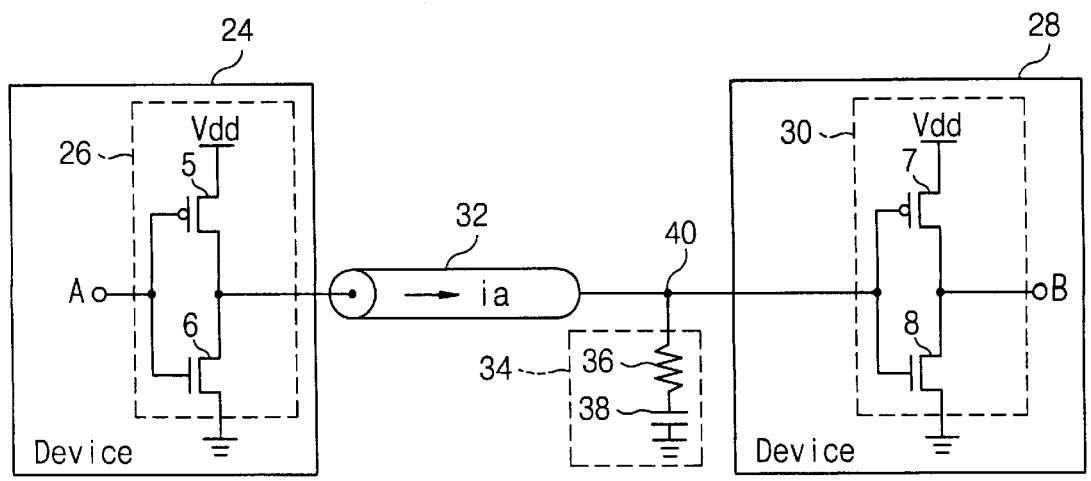
FIG. 4 is a schematic view illustrating another example of a parallel matching scheme in conventional integrated circuit devices coupled to each other through a data line.
Figure 5A:
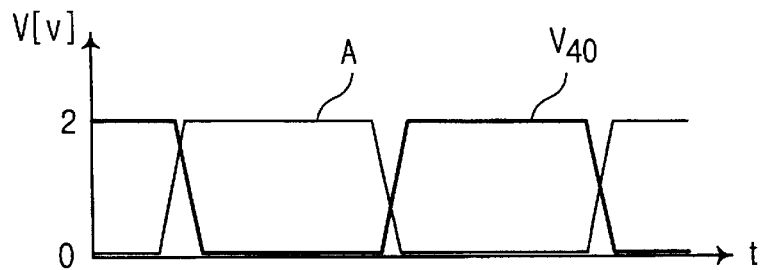
FIG. 5A is a waveform illustrating a signal at a node of a side of the receiver in accordance with an input signal of the transmitter in conventional integrated circuit devices coupled to each other through a data line as shown in FIG. 4.
Figure 5B:
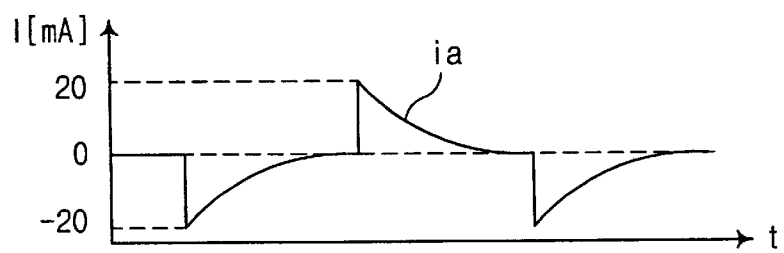
FIG. 5B is a waveform illustrating the dynamic current of the data line in conventional integrated circuit devices coupled through a data line as shown in FIG. 4.
Figure 6:
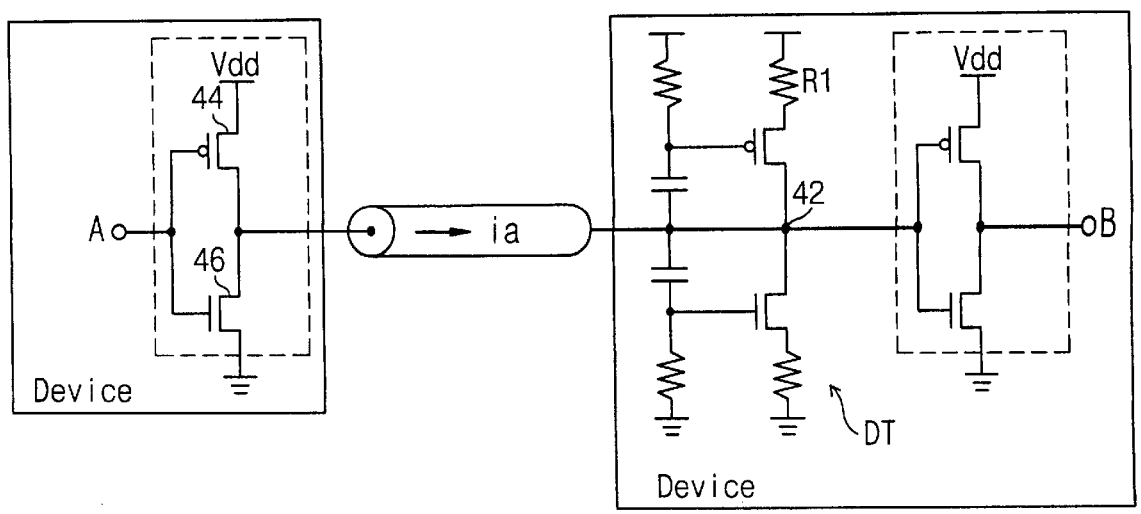
FIG. 6 is a schematic view illustrating another example of parallel matching scheme in conventional integrated circuit devices coupled to each other through a data line.
Figure 7A:
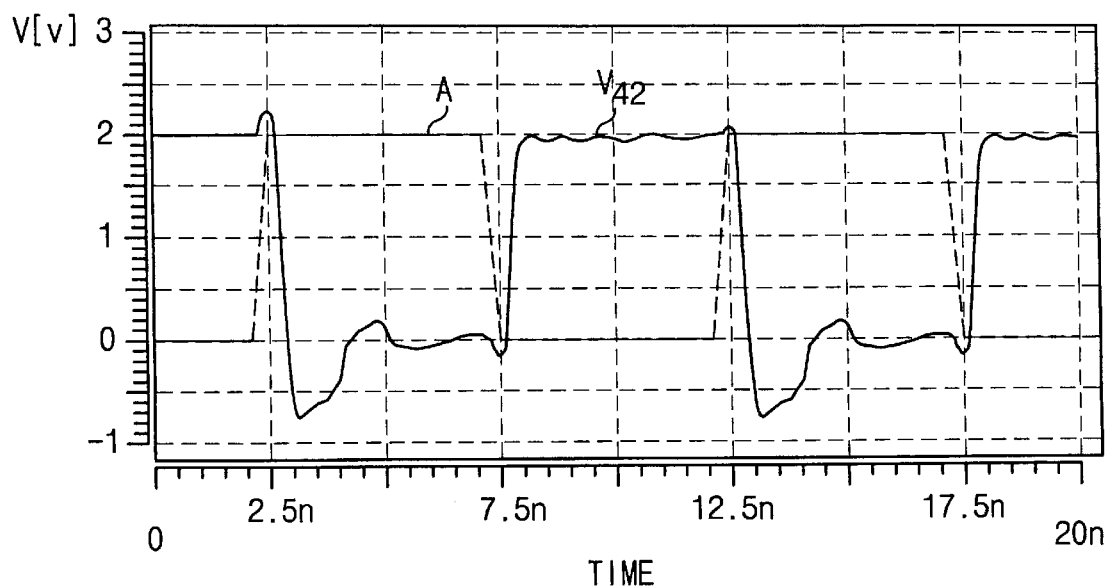
FIG. 7A is a waveform illustrating a signal at a node of a side of the receiver in accordance with an input signal of the transmitter in conventional integrated circuit devices coupled to each other through a data line as shown in FIG. 6.
Figure 7B:
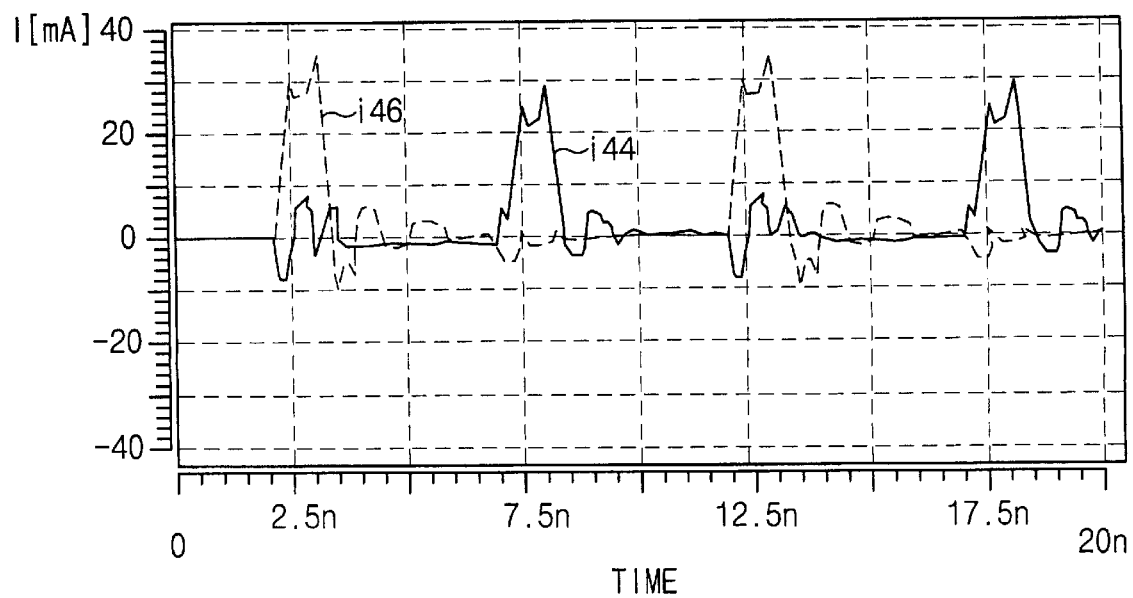
FIG. 7B is a waveform illustrating the dynamic current of one position of the transmitter output buffer and the dynamic current of the other position of the transmitter output buffer in conventional integrated circuit devices coupled to each other through a data line as shown in FIG. 6.
Figure 7C:
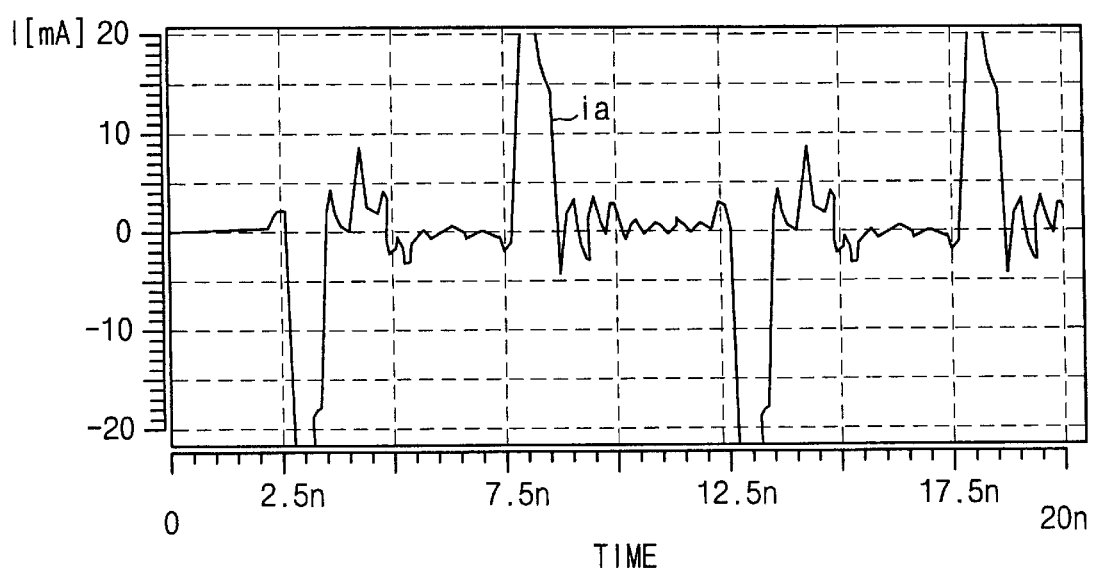
FIG. 7C is a waveform illustrating the dynamic current of the data line in conventional integrated circuit devices coupled to each other through a data line as shown in FIG. 6.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity type embodiment as well.

Figure 8A:
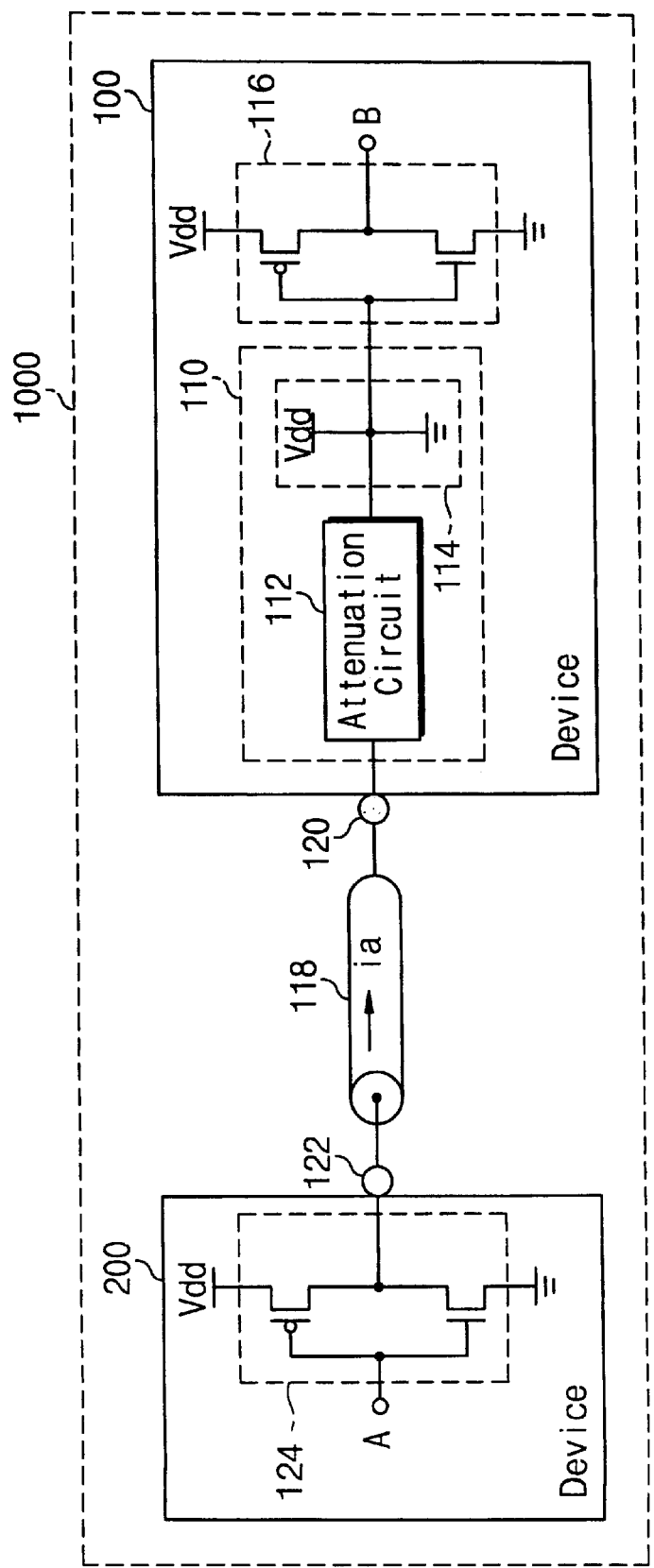
FIG. 8A is a schematic view illustrating an attenuation operation of overshoots of data line termination circuits and integrated circuit devices having the same in accordance with the present invention.
Figure 8B:
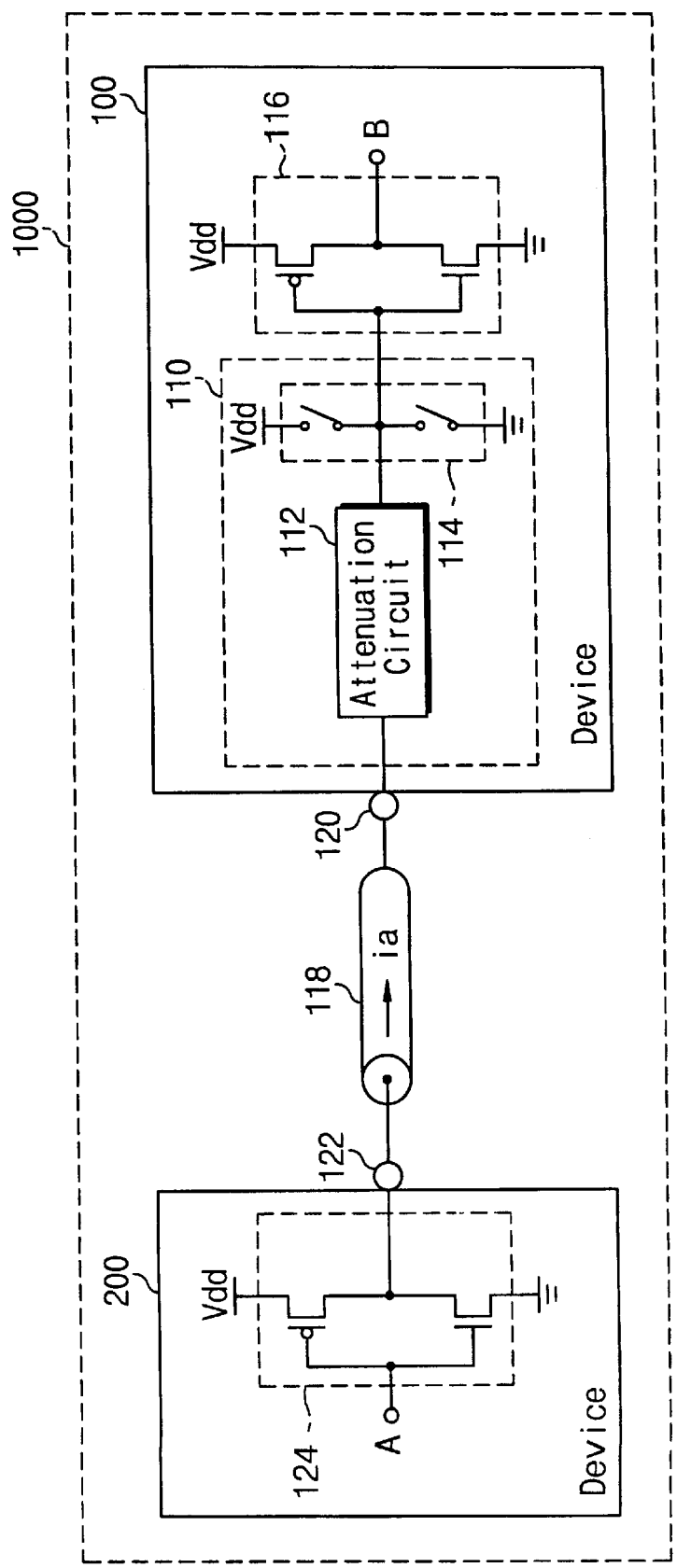
FIG. 8B is a schematic view illustrating an operation of an open-circuited state after the attenuation operation of the overshoots of data line termination circuits and integrated circuit devices having the same in accordance with the present invention.

FIG. 8A is a schematic view illustrating an attenuation operation of overshoots of data line termination circuits and integrated circuit devices having the same in accordance with a present invention. FIG. 8B is a schematic view illustrating operation of an open-circuited state after the attenuation operation of the overshoots of data line termination circuits and integrated circuit devices having the same in accordance with the present invention.

As shown in FIGS. 8A and 8B, a receiving integrated circuit device 100 includes a data line termination circuit 110 and an input buffer circuit 116. The data line termination circuit 110 is coupled to an input pin 120, also referred to as an input pad, which is coupled to the outside of the receiving integrated circuit device 100 and coupled to a data line 118 as a data bus.

A transmitted signal or input signal from the data line 118 is input to the data line termination circuit 110 through the input pin 120. The input signal comprises a logic high level or low level. Generally, when the logic level of the input signal is changed from low to high or high to low level, ringing may occur in the input signal. This ringing may be a damped oscillation wave signal. The damped oscillation wave signal may take place when it takes a long time for damping.

The input signal comprises the ringing and a stable input signal (the logic high level or low level) when the level of the input signal is changed. The ringing occurs in an initial time when the level of the input signal is changed. After the ringing is attenuated, the level of the input signal becomes the stable input signal. The ringing comprises overshoots and undershoots.

Referring back to FIG. 1, when the level of the input signal is changed from the logic low level to the high level, the voltage of the overshoots is greater than the voltage of the logic high level, and the voltage of the undershoots is less than the voltage of the logic high level. When the level of the input signal is changed from the logic high level to the low level, the voltage of the overshoots is less than the voltage of the logic low level, and the voltage of the undershoots is greater than the voltage of the logic low level.

Referring again to FIG. 8A, a data line termination circuit 110 includes an attenuation circuit 112 for reducing the overshoots of the input signal, and a charge/discharge circuit 114 for charging the undershoots of the input signal with power source Vdd when the level of the input signal is changed from the logic low level to the high level, and for discharging the undershoots of the input signals to ground when the level of the input signal is changed from the logic high level to the low level.

As shown in FIG. 8B, after the charging or discharging operation of the charge/discharge circuit 114 has been finished, the charge/discharge circuit 114 maintains an open-circuited state, so that the level of the input signal becomes the stable input signal.

In a typical termination circuit, a resistor having same impedance with characteristic impedance of the data line is located at one side of the data line. The ringing may be attenuated by the value of the resistor. Thus, conventional integrated circuit devices coupled to each other through the data line using the impedance-matching scheme have attenuated the ringing, but a large dynamic current may be consumed in the termination circuit.

Semiconductor integrated circuits, which have a fast transition time (rise time and fall time) of the signal related to a delay time of the signal at the data line, can use the overshoot attenuating scheme in order to attenuate the ringing occurring when the level of the input signal is changed. Thus, according to the invention, the data line termination circuit 110 uses the overshoot attenuating scheme instead of the impedance-matching scheme.

In the overshoot attenuating scheme, the data line termination circuit 110 performs the attenuation operation and charging/discharging operation of the input signal while the ringing occurs in the input signal, thereby attenuating the ringing. Thus, the stable input signal is supplied to the input circuit 116.

Thereafter, the data line termination circuit 110 operates as the open-circuit, thereby reducing the consumption of the dynamic current. Thus, the integrated circuit device including the data line termination circuit 110 may be improved in operational performance, and the consumption of power also may be reduced.

In the receiving integrated circuit device, the input signal comprises the ringing and the stable input signal. The stable input signal is formed when the charge/discharge circuit 114 operates in the open-circuited state.

As shown in FIGS. 8A and 8B, the integrated circuit devices 1000 coupled to each other through the data line 118 include the receiving integrated circuit device 100 and the transmission integrated circuit device 200. The receiving integrated circuit device 100 has an input pin 120. Only one input pin is shown for convenience sake, but the number of pins is not limited. The receiving integrated circuit device 100 is coupled to an output pin 122 of the transmission integrated circuit device 200 through the data line 118.

The receiving integrated circuit device 100 has an inverter 116 as the input buffer circuit, and the data line termination circuit 110 is coupled between the inverter 116 and the input pin 120. The data line termination circuit 110 has the attenuation circuit 112 coupled between the input pin 120 and the inverter 116, and the charge/discharge circuit 114 is coupled between the attenuation circuit 112 and the inverter 116. Only one data line termination circuit 110 is described for convenience sake but any number of the above-described circuits may be provided.

When the level of the input signal is changed, for example when the level of the input signal is changed from the logic high level (or the logic low level) to the low level (or the high level), the ringing may occur in the input signal input through the input pin 120. Thus, the attenuation circuit 112 may reduce and preferably eliminate the overshoots of the ringing.

After the overshoots of the ringing are reduced by the attenuation circuit 112, the input signal without the overshoots are input to the charge/discharge circuit 114. Therefore, the charge/discharge circuit 114 charges the undershoots of the ringing with the power source Vdd when the level of the input signal is changed from the logic low level to the high level, and discharges the undershoots of the ringing when the level of the input signal is changed from the logic high level to the low level.

After the charging or discharging operation of the charge/discharge circuit 114 has been completed, the charge/discharge circuit 114 becomes the open-circuited state. Thus, the charge/discharge circuit 114 functions as an open circuit.

The above-described operation will now be described in detail. In the output buffer circuit 124 of the transmission integrated circuit device 200 as shown in FIG. 8A, it is assumed that an input signal of the output buffer circuit 124 is input to an input port A of the output buffer circuit 124. When the level of the input signal is changed from the logic high level to the low level, that is, level of output signal from an output pin 122 is changed from the logic low level to the high level, the ringing occurs in the output signal from the output pin 122.

The output signal including the ringing is input to the receiving integrated circuit device 100. The output signal functions as the input signal of the receiving integrated circuit device 100. Thus, the data line termination circuit 110 of the receiving integrated circuit device 100 performs the attenuation operation and charging operation of the input signal. Accordingly, the ringing is reduced in the input signal when the level of the input signal is changed.

Assume that the input signal of the output buffer circuit 124 is input to the input port A of the output buffer circuit 124. When the level of the input signal is changed from the logic low level to the high level, that is, the level of output signal from an output pin 122 is changed from the logic high level to the low level, the ringing occurs in the output signal from the output pin 122.

The output signal including the ringing is input to the receiving integrated circuit device 100. The output signal functions as the input signal of the receiving integrated circuit device 100. Thus, the data line termination circuit 110 of the receiving integrated circuit device 100 performs the attenuation operation and discharging operation of the input signal. Accordingly, the ringing is reduced in the input signal when the level of the input signal is changed.

As shown in FIG. 8B, when the level of the input signal becomes the stable level (the logic low level or the high level), the charge/discharge circuit 114 operates as an open-circuit. Therefore, the stable level of the input signal is input to the input buffer circuit 116.

First Embodiment

Figure 9:
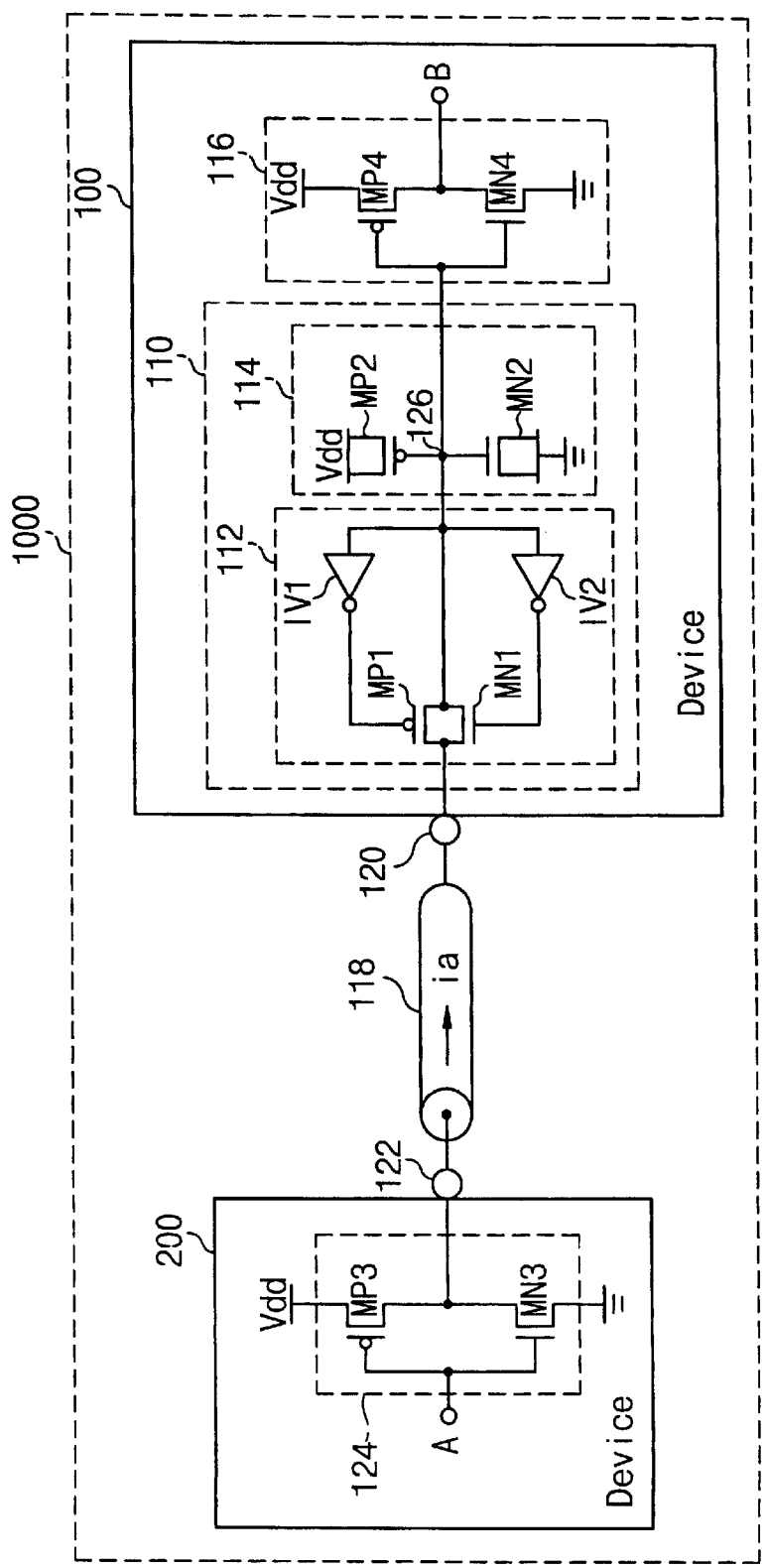
FIG. 9 is a schematic view illustrating data line termination circuits in accordance with a first embodiment of the present invention.

FIG. 9 is a schematic view illustrating a data line termination circuit 110 in accordance with a first embodiment of the present invention.

As shown in FIG. 9, the data line termination circuit 110 includes the attenuation circuit 112 and the charge/discharge circuit 114. The attenuation circuit 112 has two inverters IV1 and IV2, a PMOS transistor MP1, and an NMOS transistor MN1. Each input port of the inverter IV1 and IV2 is coupled to the input port of the input buffer circuit 116.

The PMOS transistor MP1 is coupled between the input pin 120 and the charge/discharge circuit 114. The gate of PMOS transistor MP1 is coupled to the output port of inverter IV1 and is driven by output signal of the inverter IV1, so that the current from the input pin 120 flows into the input node 126 of the charge/discharge circuit 114. The input node 126 is also coupled to the input port 126 of the input buffer circuit 116.

The NMOS transistor MN1 is coupled between the input pin 120 and the charge/discharge circuit 114. The gate of NMOS transistor MN1 is coupled to the output port of inverter IV2 and is driven by output signal of the inverter IV2, so that the current from the input pin 120 flows into the input node 126 of the charge/discharge circuit 114. Only one PMOS and NMOS transistor MP1 and MN1 has been described for convenience sake, but any number of transistors may be used. That is, the pair of PMOS and NMOS transistors can be coupled to a plurality of pairs in the attenuation circuit 112. A pair of inverters IV1 and IV2 also have only been described for convenience sake, but are not limited to the number of the inverters. That is, the pair of IV1 and IV2 can be coupled to a plurality of pairs in the attenuation circuit 112.

The charge/discharge circuit 114 has a PMOS transistor MP2 for functioning as a capacitor, and an NMOS transistor MN2 for functioning as the capacitor. The PMOS transistor MP2 has a gate coupled to the input node 126 of input buffer circuit 116, and a source and a drain are coupled to the power source Vdd. The NMOS transistor MN2 has a gate coupled to the input port 126 of input buffer circuit 116, and a source and a drain that are coupled to ground. Preferably, the size of PMOS transistor MP2 is 125/1 [W/L; width/length], the NMOS transistor MN2 is 50/1 [W/L].

In FIG. 9, only one data line termination circuit 110 has been described for convenience sake, but any number of circuits may be used.

The operation of the data line termination circuit according to the first embodiment of the invention will now be described.

It is assumed that the input port 126 of input buffer circuit 116 is the logic low level. At this time, the PMOS transistor MP1 coupled to the output port of the inverter IV1 is turned off by the output signal of the inverter IV1, and the NMOS transistor MN1 coupled to the output port of the inverter IV2 is turned on by the output signal of the inverter IV2.

In other words, the input signal is input to the input pin 120 through the data line 118. When the level of the input signal is changed, for example the level of the input signal is changed from the logic low level to the high level, the ringing occurs in the input signal input through the input pin 120. The ringing included in the input signal can be reduced and preferably eliminated by the NMOS transistor MN1 functioning as a resistor. The input signal without the overshoots of the ringing is input to the PMOS and NMOS transistors MP2 and MN2 functioning as capacitors.

Thereafter, the PMOS and NMOS transistors MP2 and MN2 charge the undershoots of the ringing with the power source Vdd as shown in FIG. 8A. As described above, when the PMOS and NMOS transistors MP2 and MN2 charge the undershoots of the ringing, the PMOS and NMOS transistors MP2 and MN2 function as a short circuit. After the undershoots of the ringing are charged as described above, the level of the input signal becomes the stable level. As shown in FIG. 8B, the PMOS and NMOS transistors MP2 and MN2 function as an open circuit.

When the level of the input signal is changed from the logic high level to the low level, the ringing occurs in the input signal input through the input pin 120. The ringing included in the input signal is reduced and preferably eliminated by the PMOS transistor MP1 functioning as a resistor. The input signal without the overshoots of the ringing is input to the PMOS and NMOS transistors MP2 and MN2 functioning as capacitors.

Thereafter, the PMOS and NMOS transistors MP2 and MN2 discharge the undershoots of the ringing as shown in FIG. 8A. As described above, when the PMOS and NMOS transistors MP2 and MN2 discharge the undershoots of the ringing to ground, the PMOS and NMOS transistors MP2 and MN2 function as a short circuit. After the undershoots of the ringing are discharged as described above, the level of the input signal becomes the stable level. As shown in FIG. 8B, the PMOS and NMOS transistors MP2 and MN2 function as an open circuit.

As described above, the PMOS and NMOS transistors MP2 and MN2 operate as an open circuit, so that the further dynamic current does not flow in the charge/discharge circuit 114. As a result, the dynamic current consumed in the data line termination circuit 110 may be reduced when the level of the input signal is changed.

In a preferred embodiment according to the invention, the size of PMOS and NMOS transistor MP2 and MN2 as the capacitor is 12/12[W/L], and the power source of the output buffer circuit 124 of the transmission integrated circuit device 200 is 2V.

Figure 10A:
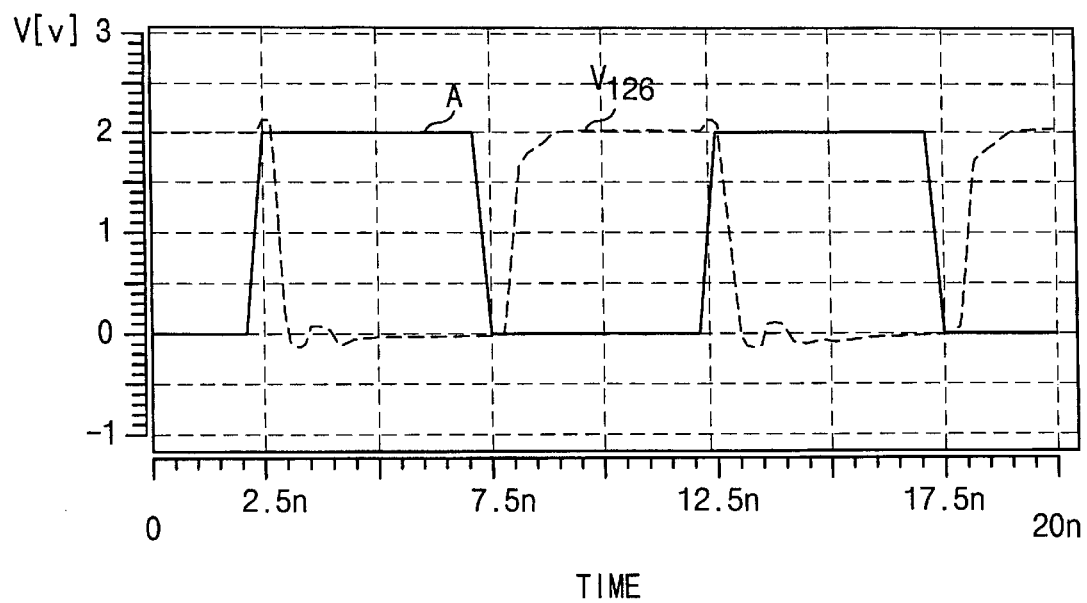
FIG. 10A is a waveform illustrating a signal at a node of a side of the receiver in accordance with an input signal of the transmitter in integrated circuit devices coupled to each other through a data line as shown in FIG. 9.
Figure 10B:
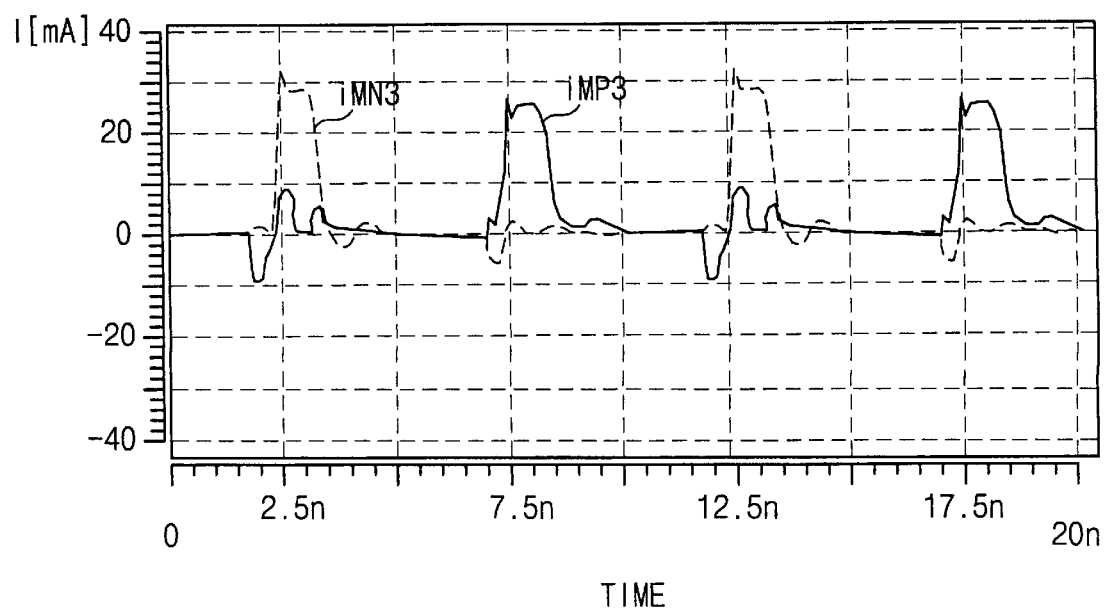
FIG. 10B is a waveform illustrating the dynamic current at a PMOS transistor of the transmitter output buffer and the dynamic current at an NMOS transistor of the transmitter output buffer in integrated circuit devices coupled to each other through a data line as shown in FIG. 9.
Figure 10C:
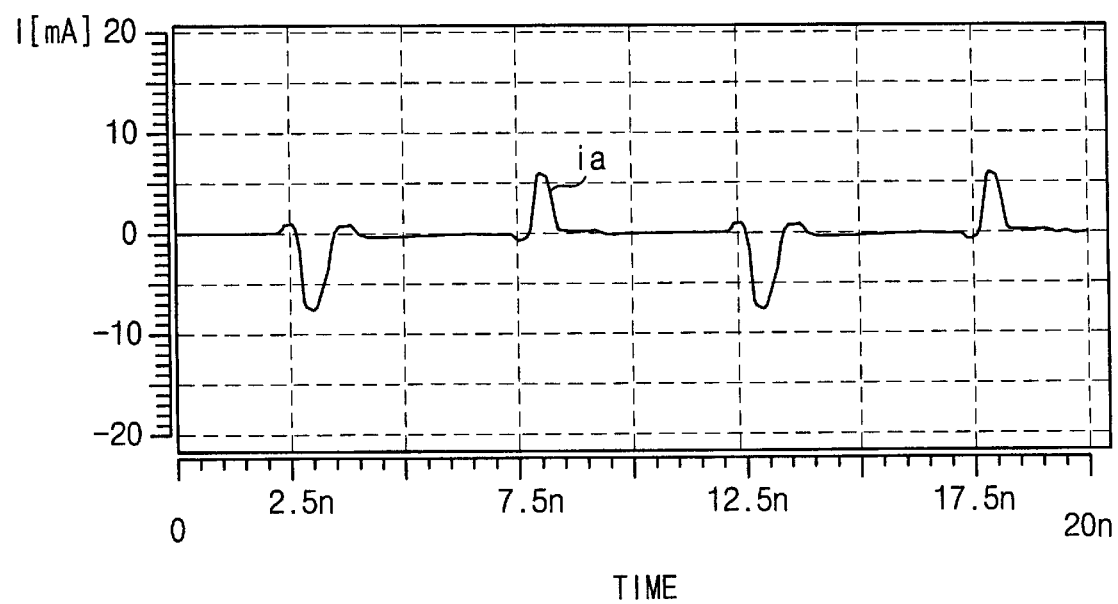
FIG. 10C is a waveform illustrating the dynamic current of the data line in integrated circuit devices coupled to each other through the data line as shown in FIG. 9.

FIG. 10A is a waveform illustrating signal V126 at a node 126 of a side of the receiver in accordance with input signal A of the transmitter in integrated circuit devices coupled each other through a data line as shown in FIG. 9. FIG. 10B is a waveform illustrating the dynamic current iMP3 at a PMOS transistor of the transmitter output buffer and the dynamic current iMN3 at an NMOS transistor of the transmitter output buffer in integrated circuit devices coupled to each other through a data line as shown in FIG. 9. Also, FIG. 10C is a waveform illustrating the dynamic current ia of a data line in integrated circuit devices coupled to each other through a data line as shown in FIG. 9.

As shown in FIG. 10A, when the level of the input signal A of the transmitter is changed, the signal V126 at a node 126 of the receiver shows that the ringing is greatly reduced. As shown in FIG. 10C, the dynamic current ia consumed in the data line termination circuit 110 is instantaneously consumed only when the level of the input signal is changed. This is because the charge/discharge circuit 114 operates as a short circuit when the level of the input signal is changed and operates as an open circuit when the level of the input signal is not changed. As a result, the consumption of the dynamic current is reduced when the level of the input signal is changed.

Second Embodiment

Figure 11:
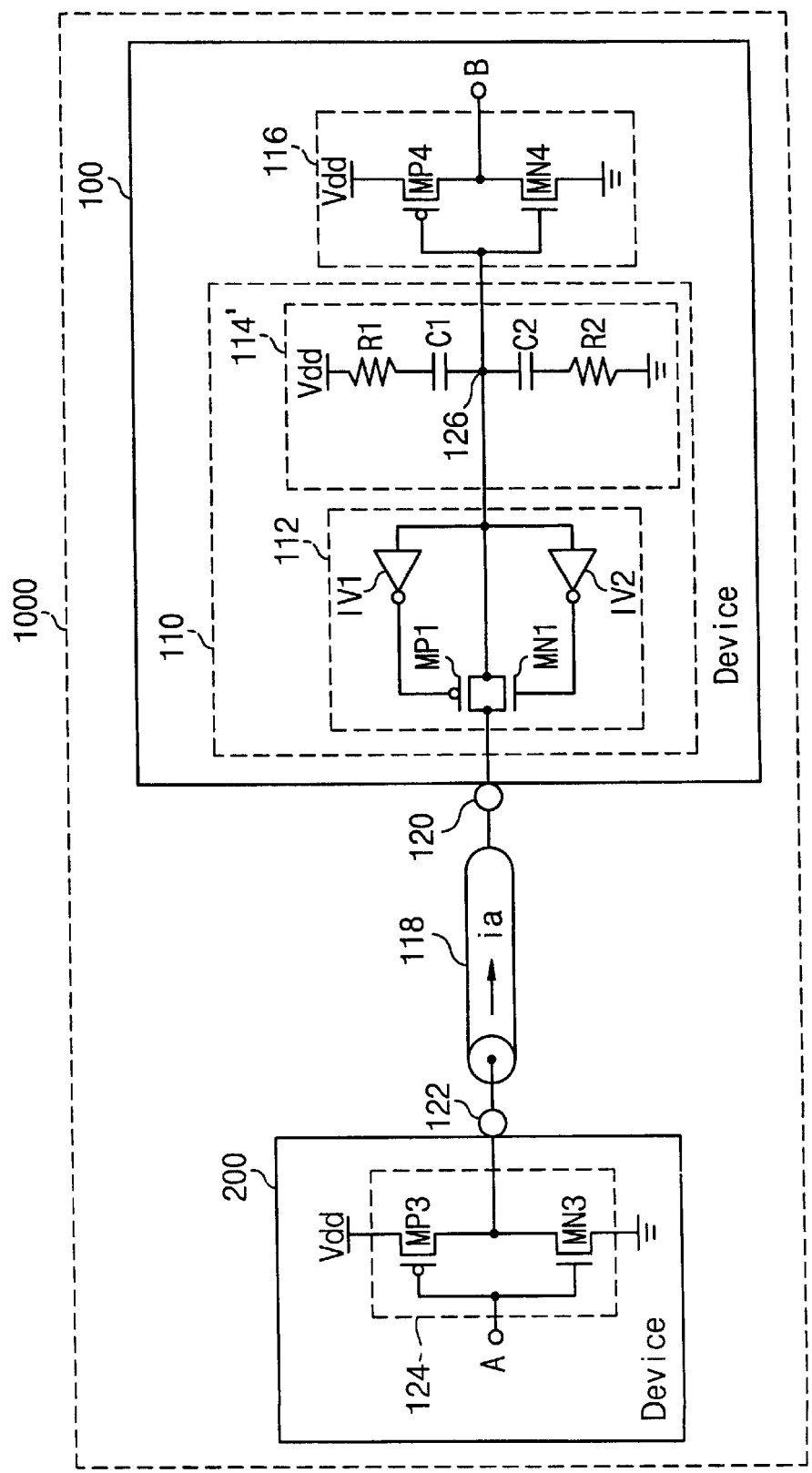
FIG. 11 is a schematic view illustrating the data line termination circuits in accordance with a second embodiment of the present invention.

FIG. 11 is a schematic view illustrating the data line termination circuit 110 in accordance with a second embodiment of the present invention. Those elements of the semiconductor integrated circuit common to both FIG. 11 and FIG. 9 will thus carry the same reference numbers so that no further explanation is deemed necessary.

The data line termination circuit 110 according to the first embodiment and the second embodiment differ in the charge/discharge circuit 114'.

As shown in FIG. 11, the charge/discharge circuit 114' according to the second embodiment includes two capacitors C1 and C2, and two resistors R1 and R2. The resistor R1 and the capacitor C1 are coupled between the power source Vdd and the input port 126 of input buffer circuit 116 in series. The capacitor C2 and the resistor R2 are coupled between the input port 126 of input buffer circuit 116 and ground in series. The value of resistors R1 and R2 preferably is 1KΩ, the value of capacitors C1 and C2 preferably is 0.25 pF.

A time constant is determined by the resistors R1 and R2 and the capacitors C1 and C2. Thus, the operational time of the charge/discharge circuit 114 is determined by the time constant. Accordingly, an optimal charge/discharge circuit 114' may be provided for various integrated circuit devices, thereby improving operational efficiency of the integrated circuit device.

The charge/discharge circuit 114' according to the second embodiment also performs the same function as described above in the first embodiment. For example, the charge/discharge circuit 114' operates as the short circuit when the level of the input signal is changed and operates as the open circuit when the level of the input signal is not changed. As a result, the consumption of the dynamic current is also reduced when the level of the input signal is changed.

Third Embodiment

Figure 12:
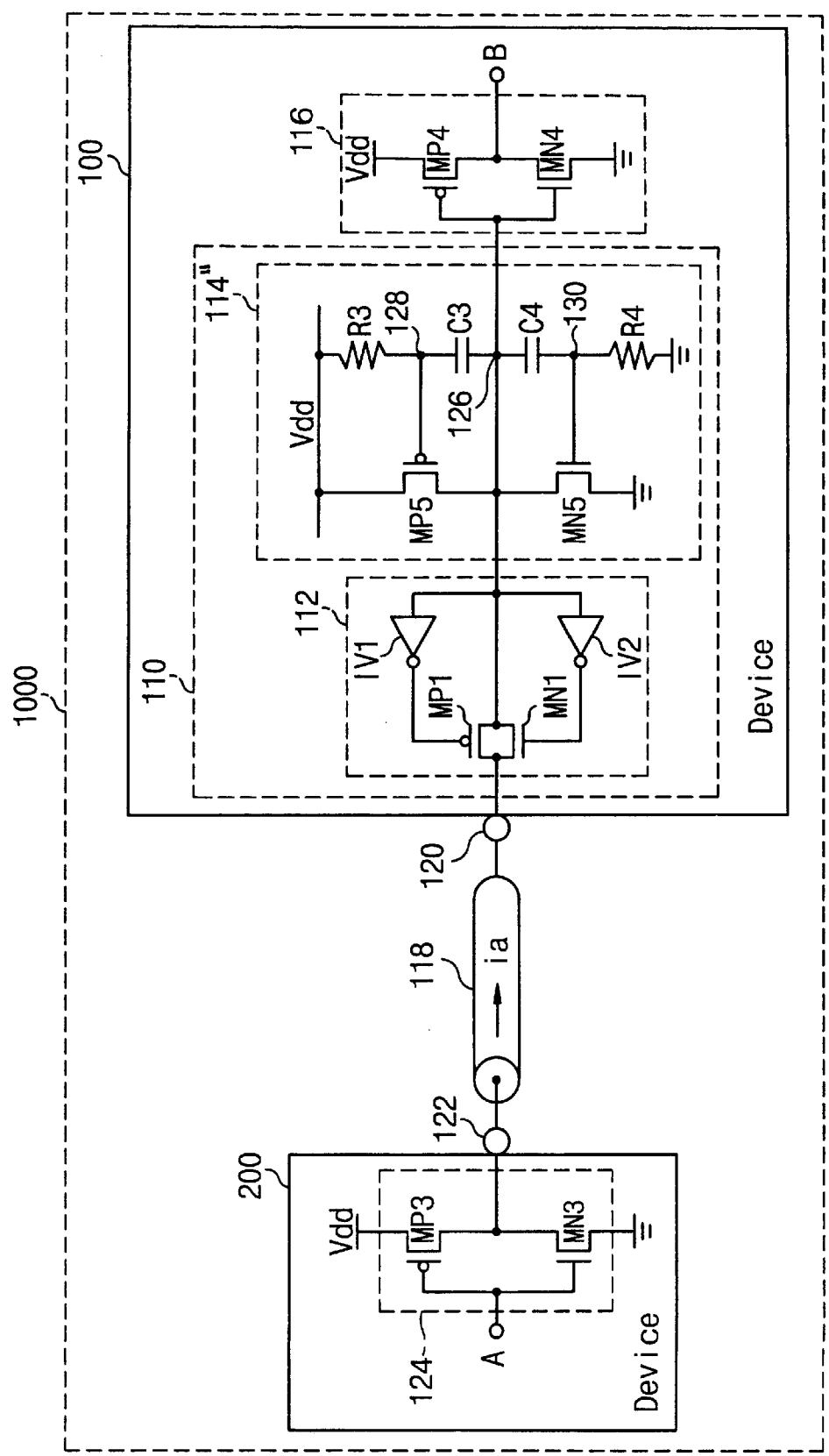
FIG. 12 is a schematic view illustrating data line termination circuits in accordance with a third embodiment of the present invention.

FIG. 12 is a schematic view for illustrating the data line termination circuit in accordance with a preferred third embodiment of the present invention. Those elements of the semiconductor integrated circuit common to both FIG. 12 and FIG. 9 will thus carry the same reference numbers so that no further explanation is deemed necessary.

The data line termination circuit 110, according to the first to the third embodiments, differ in the charge/discharge circuit 114'.

As shown in FIG. 12, the charge/discharge circuit 114' according to the third embodiment includes two capacitors C3 and C4, two resistors R3 and R4, a PMOS transistor MP5, and an NMOS transistor MN5. The resistor R3 and the capacitor C3 are coupled between the power source Vdd and the input port 126 of input buffer circuit 116 in series. The capacitor C4 and the resistor R4 are coupled between the input port 126 of input buffer circuit 116 and ground in series.

The current path of PMOS transistor MP5 is formed between the power source Vdd and the input port 126 of input buffer circuit 116, and the gate of PMOS transistor MP5 is coupled to a node 128 between the resistor R3 and the capacitor C3 and is driven by the voltage of the node 128.

The current path of NMOS transistor MN5 is formed between the input port 126 of input buffer circuit 116 and ground, and the gate of NMOS transistor MN5 is coupled to a node 130 between the capacitor C4 and the resistor R4 and is driven by the voltage of the node 130.

When the level of the input signal is changed from the logic low level to the high level, the PMOS and NMOS transistors MP5 and MN5 are driven by the voltage of the respective node 128 and node 130. Thus, the power source Vdd rapidly charges the undershoots of the ringing through the PMOS and NMOS transistors MP5 and MN5.

When the level of the input signal is changed from the logic high level to the low level, the PMOS and NMOS transistors MP5 and MN5 are driven by the respective voltage of the node 128 and node 130. Thus, the undershoots of the ringing rapidly discharges to the power source Vdd and ground through the PMOS and NMOS transistors MP5 and MN5. Thus, the operational efficiency of the integrated circuit device may be improved.

The charge/discharge circuit 114" according to the third embodiment also performs the same function as described above in the first embodiment. For example, the charge/discharge circuit 114" operates as the short circuit when the level of the input signal is changed and operates as the open circuit when the level of the input signal is not changed. As a result, the consumption of the dynamic current is also reduced when the level of the input signal is changed.

Fourth Embodiment

Figure 13:
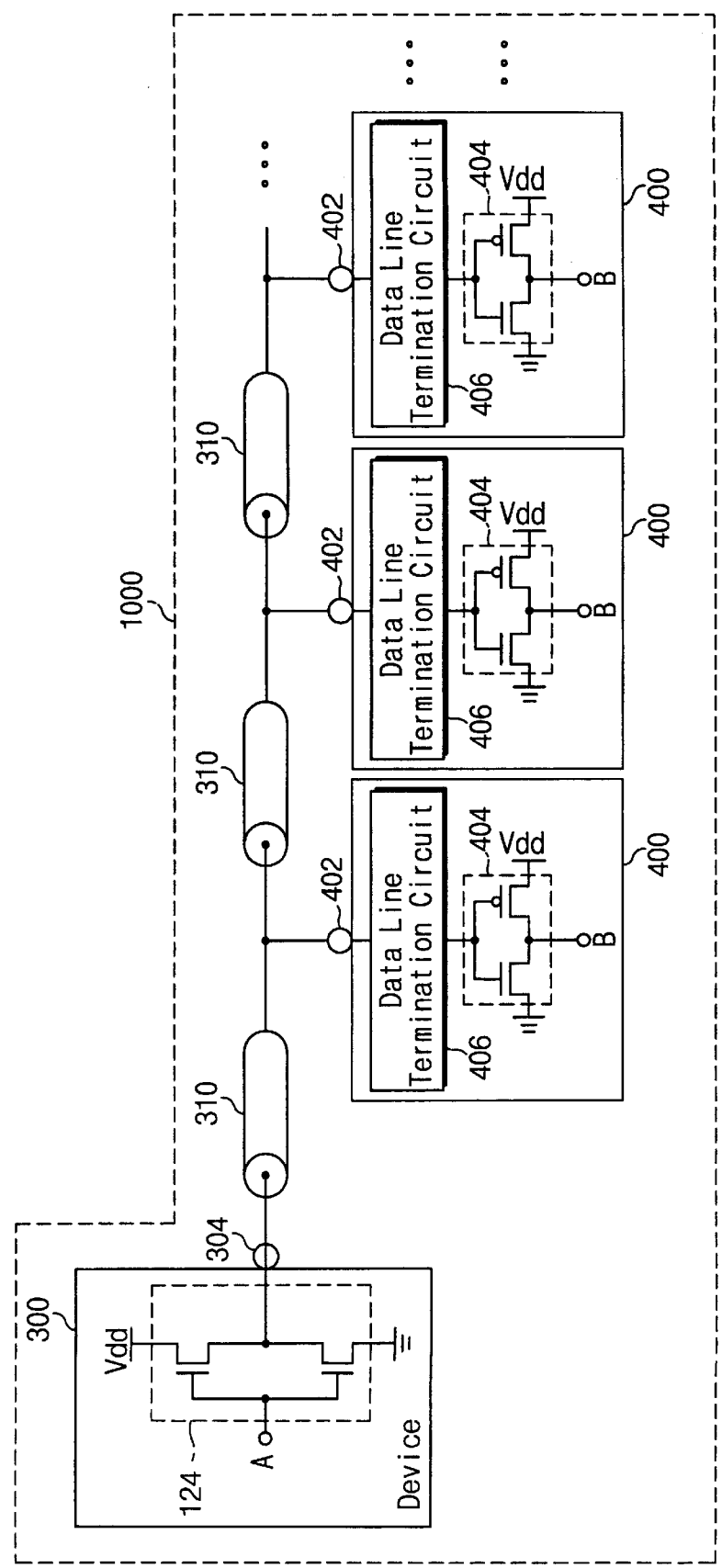
FIG. 13 is a schematic view illustrating integrated circuit devices for a point-to-multipoint data transmission in accordance with a fourth embodiment of the present invention.

FIG. 13 is a schematic view for illustrating integrated circuit devices for a point-to-multipoint data transmission in accordance with a fourth embodiment of the present invention.

As shown in FIG. 13, the integrated circuit device according to a point-to-multipoint data transmission method includes a transmission integrated circuit device 300 and a plurality of receiving integrated circuit devices 400. The transmission integrated circuit device 300 has at least one output buffer circuit 124 which has at least one output pin 304, and is coupled to the data line 310 through at least one output pin 304.

Each receiving integrated circuit device 400 is coupled to the data line 310 in parallel. Each receiving integrated circuit device 400 has at least one input pin 402 coupled to the data line 310, and at least one input buffer circuit 404 coupled to each input pin 402 through each data line termination circuit 406.

Each data line termination circuit 406 is coupled between each input pin 402 and each input buffer circuit 404. Each data line termination circuit 406 performs the attenuation operation and charging/discharging operation of the input signal when the ringing occurs in the input signal, so that the ringing is reduced in the input signal. Thus, the level of the input signal becomes the stable level.

The data line termination circuit 406 comprises one of the circuits according to the first to third embodiments, and the function thereof also is the same. The data line termination circuit 406 in each receiving integrated circuit device 400 should not be adapted to the impedance-matching scheme but rather should be adapted to the overshoot attenuating scheme according to the invention, so that each receiving integrated circuit device 400 may be adapted to data transmission from the transmission integrated circuit device 300.

When the impedance-matching scheme is adapted to a point-to-multipoint semiconductor integrated circuit, the impedance of data line that is seen from each receiving integrated circuit device may differ from each other. Thus, it may be difficult to embody a point-to-multipoint semiconductor integrated circuit. In contrast, when the overshoot attenuating scheme is adapted to a point-to-multipoint semiconductor integrated circuit, the data line termination circuit according to the invention may be easily embodied in a point-to-multipoint semiconductor integrated circuit because the adaptation of the overshoot attenuating scheme may be easier than the impedance-matching scheme, since the overshoot attenuating scheme reduces only the overshoots of the signal.

Fifth Embodiment

Figure 14:
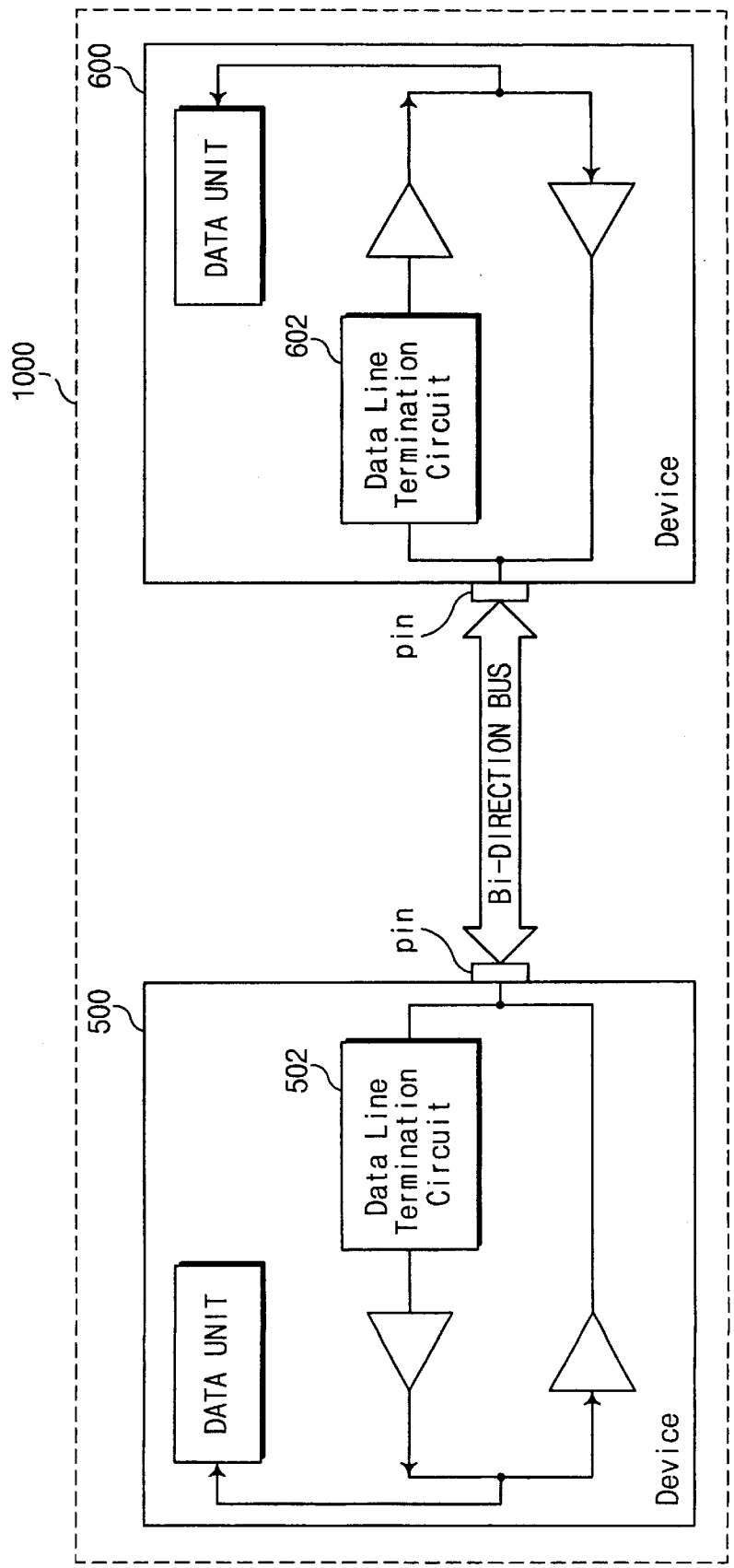
FIG. 14 is a schematic view illustrating integrated circuit devices for a bidirectional data transmission in accordance with a fifth embodiment of the present invention.

FIG. 14 is a schematic view illustrating integrated circuit devices for bidirectional data transmission in accordance with a fifth embodiment of the present invention.

As described above in the first to fourth embodiments, the receiving integrated circuit device receives the signal from the transmission integrated circuit device through the bidirectional data line (or bus). The overshoot attenuating scheme according to the invention is not limited to a uni-directional data line.

As shown in FIG. 14, a semiconductor integrated circuit includes two devices 500 and 600 which communicate with each other. Generally, each device 500 and 600 is an integrated circuit. For example, one of the devices 500 and 600 may comprise a memory device such as an SRAM, a DRAM, an EEPROM, an EPROM, and a flash memory device; an interface device; any peripheral device; a DMA device; a communication apparatus; a timer; an analog circuit; a microprocessor; a pipelined execution device; an ASIC (application specific integrated circuit); a PLA; a DSP (digital signal processor); a computer; a CPU; an IC; etc.

As shown in FIG. 14, the data line termination circuits 502 and 602 provided with each device comprise one of the circuits according to the first to fourth embodiments, and the function thereof also is the same, so that no further explanation is deemed necessary.

Figure 15:
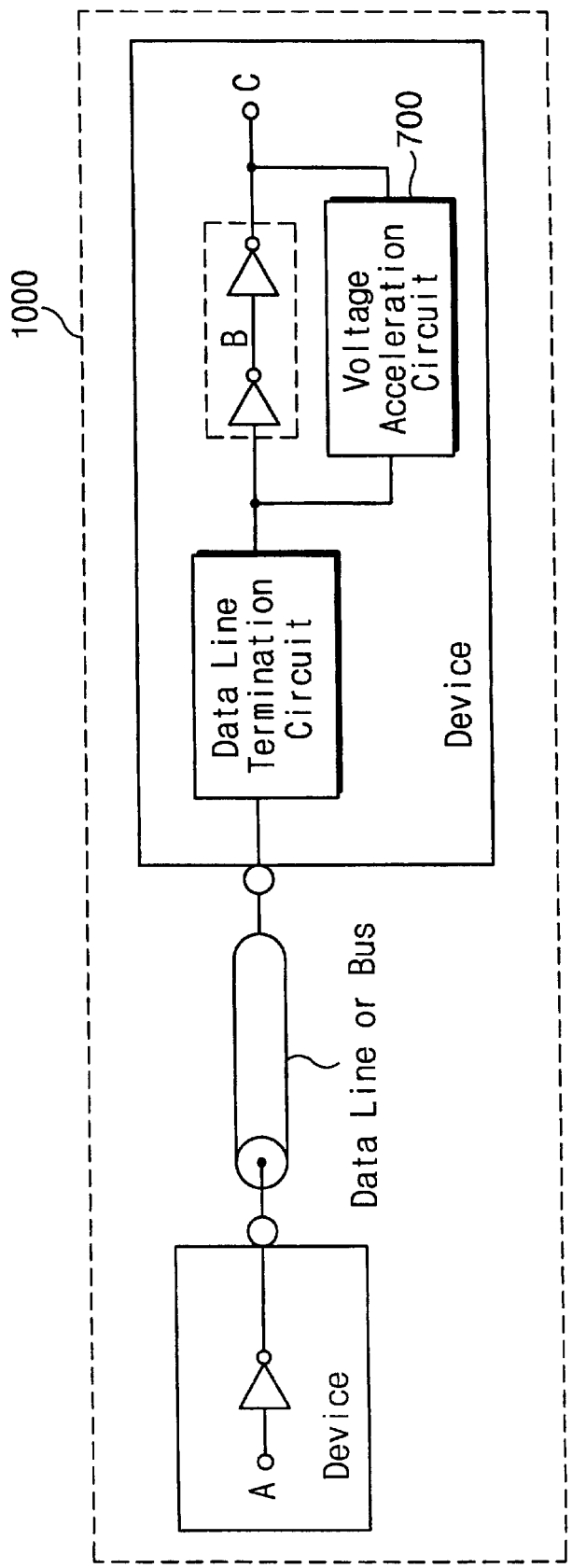
FIG. 15 is a schematic view illustrating integrated circuit devices with a voltage acceleration circuit for preventing signal delay of the data line termination circuit in accordance with the present invention.

FIG. 15 is a schematic view illustrating an integrated circuit device with a voltage acceleration circuit for preventing signal delay of the data line termination circuit in accordance with the present invention.

When the delay of the transmitting signal occurs at the data line termination circuit according to first to fourth embodiments as shown in FIG. 15, a voltage acceleration circuit 700 may be coupled to the input buffer circuit in parallel. Thus, the voltage acceleration circuit 700 reduces and preferably prevents the delay of the signal. The voltage acceleration circuit 700 is known to those skilled in the art.

Figure 16A:
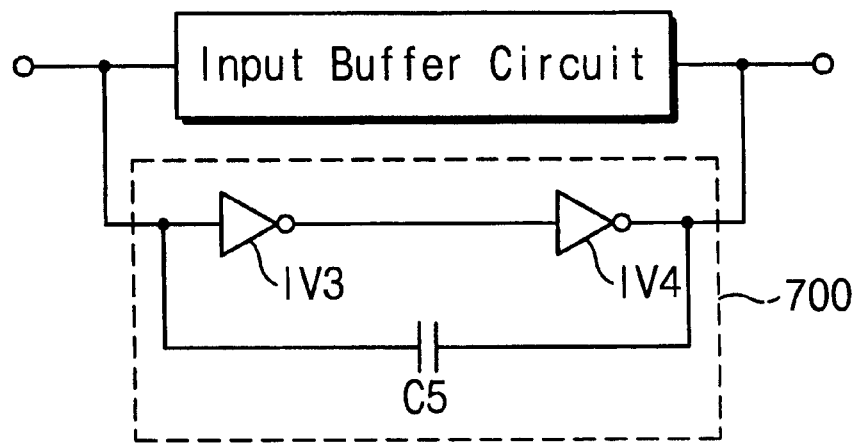
FIGS. 16A and 16B are detailed circuit diagrams for illustrating a configuration of the voltage acceleration circuit in the integrated circuit devices as shown in FIG. 15.
Figure 16B:
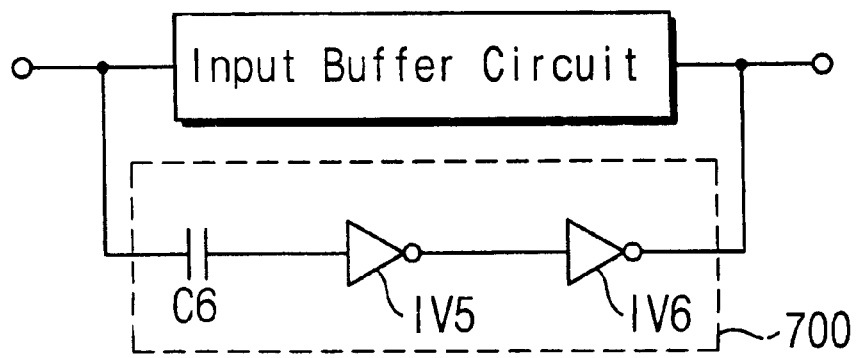

FIGS. 16A and 16B are circuit diagrams for illustrating a detailed configuration of the voltage acceleration circuit in the integrated circuit device as shown in FIG. 15. The detailed circuits as shown in FIGS. 16A and 16B are the voltage acceleration circuit 700, and are known to those skilled in the art.

As described above, when ringing occurs in the input signal, the data line termination circuit performs the attenuation operation and charging/discharging operation of the input signal and supplies the stable input signal to the input circuit, to allow improved operational performance of the integrated circuit device. The consumption of the power also may be reduced during the signal transmission, and the integrated circuit devices for a point-to-multipoint data transmission may be easily embodied.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device comprising:
   an input pin that receives an input signal from a data line;
   an input circuit that transfers the input signal to internal circuitry of the integrated circuit device; and
   a data line termination circuit coupled between the input pin and the input circuit, to reduce ringing of the input signal;
   wherein the data line termination circuit includes:
      an attenuation circuit coupled to the input pin, to reduce overshoots of the input signal; and
      a charge/discharge circuit coupled between the attenuation circuit and the input circuit, to charge undershoots of the input signal to a power supply level when the input signal changes from a logic low level to a logic high level, and to discharge the undershoots of the input signal to ground when the input signal changes from the logic high level to the logic low level;
   wherein the attenuation circuit comprises:
      a first inverter having an output port, and an input port coupled to a first node;
      a second inverter having an output port, and an input port coupled to the first node;
      a first PMOS transistor having a drain and a source that are serially coupled between the input pin and the first node, and a gate coupled to the output port of the first inverter; and a first NMOS transistor having a drain and a source that are serially coupled between the input pin and the first node, and a gate coupled to the output port of the second inverter.

2. The integrated circuit device according to claim 1, wherein the first PMOS transistor and the first NMOS transistor function as a resistor.

3. The integrated circuit device according to claim 1, wherein the first inverter comprises a plurality of first inverters that are serially coupled between the gate of the first PMOS transistor and the first node.

4. The integrated circuit device according to claim 1, wherein the second inverter comprises a plurality of second inverters that are serially coupled between the gate of the first NMOS transistor and the first node.

5. The integrated circuit device according to claim 1, wherein the charge/discharge circuit comprises:
   a first capacitor that is coupled between the power supply level and a first node, and a second capacitor that is coupled between the first node and ground; the first node being coupled to the attenuation circuit and to the input circuit.

6. The integrated circuit device according to claim 5, wherein the first capacitor is a PMOS transistor having a source and a drain coupled to the power supply level and a gate coupled to the first node, and the second capacitor is an NMOS transistor having a source and a drain coupled to ground and a gate coupled to the first node.

7. The integrated circuit device according to claim 1, wherein the charge/discharge circuit further comprises:
a first resistor and a first capacitor that are serially coupled between the power supply level and a first node; and
a second resistor and a second capacitor that are serially coupled between the first node and ground; the first node being coupled to the attenuation circuit and to the input circuit.

8. The integrated circuit device according to claim 7, wherein the charge/discharge circuit further comprises:
a first switch coupled between the power supply level and the first node, and switched by a second node that is defined between the first resistor and the first capacitor; and
a second switch coupled between the first node and ground, and switched by a third node that is defined between the second resistor and the second capacitor.

9. The integrated circuit device according to claim 8, wherein the first switch is a PMOS transistor, and the second switch is an NMOS transistor.

10. The integrated circuit device according to claim 1, further comprising a voltage acceleration circuit in parallel with the input circuit, the voltage acceleration circuit compensating for a delay in the data line termination circuit.

11. An integrated circuit device comprising:
means for receiving an input signal from a data line;
means for reducing overshoots of the input signal;
means for charging undershoots of the input signal to a power supply level when the input signal changes from a logic low level to a logic high level, and for discharging the undershoots of the input signal to ground when the input signal changes from the logic high level to the logic low level; and
means for transferring the input signal with reduced overshoots and charged/discharged undershoots to internal circuitry of the integrated circuit device;
wherein the means for reducing overshoots comprises:
a first inverter having an output port, and an input port coupled to a first node;
a second inverter having an output port, and an input port coupled to the first node;
a first PMOS transistor having a drain and a source that are serially coupled between the input pin and the first node, and a gate coupled to the output port of the first inverter; and a first NMOS transistor having a drain and a source that are serially coupled between the input pin and the first node, and a gate coupled to the output port of the second inverter.

12. The integrated circuit device according to claim 11, wherein the means for charging and discharging comprises:
a first capacitor that is coupled between the power supply level and a first node, and a second capacitor that is coupled between the first node and ground.

13. An integrated circuit device comprising:
an input pin that receives an input signal from a data line;
an input circuit that transfers the input signal to internal circuitry of the integrated circuit device;
a first inverter having an output port, and an input port coupled to a first node;
a second inverter having an output port, and an input port coupled to the first node;
a first PMOS transistor having a drain and a source that are serially coupled between the input pin and the first node, and a gate coupled to the output port of the first inverter; and
a first NMOS transistor having a drain and a source that are serially coupled between the input pin and the first node, and a gate coupled to the output port of the second inverter.

14. The integrated circuit device according to claim 13, wherein the first PMOS transistor and the first NMOS transistor function as a resistor.

15. The integrated circuit device according to claim 13, wherein the first inverter comprises a plurality of first inverters that are serially coupled between the gate of the first PMOS transistor and the first node.

16. The integrated circuit device according to claim 13, wherein the second inverter comprises a plurality of second inverters that are serially coupled between the gate of the first NMOS transistor and the first node.

17. An integrated circuit device comprising:
means for receiving an input signal from a data line;
means for reducing overshoots of the input signal without reducing undershoots of the input signal, independent of the impedance of the data line; and
means for transferring the input signal with reduced overshoots to internal circuitry of the integrated circuit device;
wherein the means for reducing comprises:
a first inverter having an output port, and an input port coupled to a first node;
a second inverter having an output port, and an input port coupled to the first node;
a first PMOS transistor having a drain and a source that are serially coupled between the input pin and the first node, and a gate coupled to the output port of the first inverter; and a first NMOS transistor having a drain and a source that are serially coupled between the input pin and the first node, and a gate coupled to the output port of the second inverter.

* * * * *